United States Patent

Baker et al.

[11] Patent Number: 6,144,104
[45] Date of Patent: Nov. 7, 2000

[54] HIGH-OPERATING-TEMPERATURE ELECTRONIC COMPONENT

[75] Inventors: Jay DeAvis Baker, W. Bloomfield; Mohan R. Paruchuri, Canton; Prathap Amerwai Reddy; Vivek Amir Jairazbhoy, both of Farmington Hills, all of Mich.

[73] Assignee: Visteon Corporation, Dearborn, Mich.

[21] Appl. No.: 09/275,129

[22] Filed: Mar. 24, 1999

[51] Int. Cl.⁷ .......................... H01K 23/48; H01K 23/52
[52] U.S. Cl. .............................................................. 257/783
[58] Field of Search ............................................. 257/783

[56] References Cited

U.S. PATENT DOCUMENTS

| | | |
|---|---|---|
| 4,357,162 | 11/1982 | Guan . |
| 4,487,638 | 12/1984 | Hoge . |
| 4,737,839 | 4/1988 | Burt . |
| 4,739,917 | 4/1988 | Baker . |
| 4,903,118 | 2/1990 | Shuhei Iwade . |
| 5,504,374 | 4/1996 | Oliver et al. . |
| 5,612,403 | 3/1997 | Nguyen et al. . |

*Primary Examiner*—David E. Graybill
*Attorney, Agent, or Firm*—Leslie C. Hodges

[57] ABSTRACT

A product for attaching an electronic component, such as a semiconductor die, to a substrate includes a relatively low-melting-temperature solder preform applied to the substrate; and a bead of a curable bonding material applied to the substrate around the periphery of the solder preform in an amount sufficient to substantially contain the solder material and bridge the gap between the die and the substrate upon a subsequent collapse of the solder preform along its thickness dimension.

15 Claims, 2 Drawing Sheets

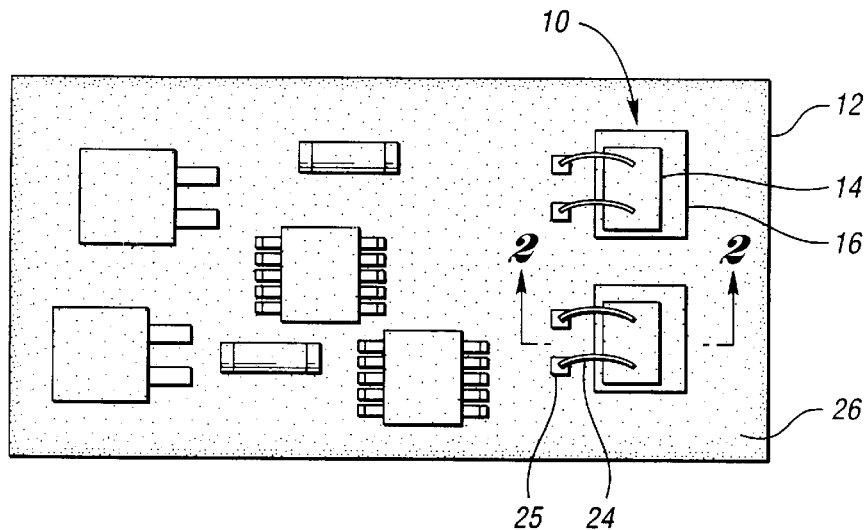
Fig. 1
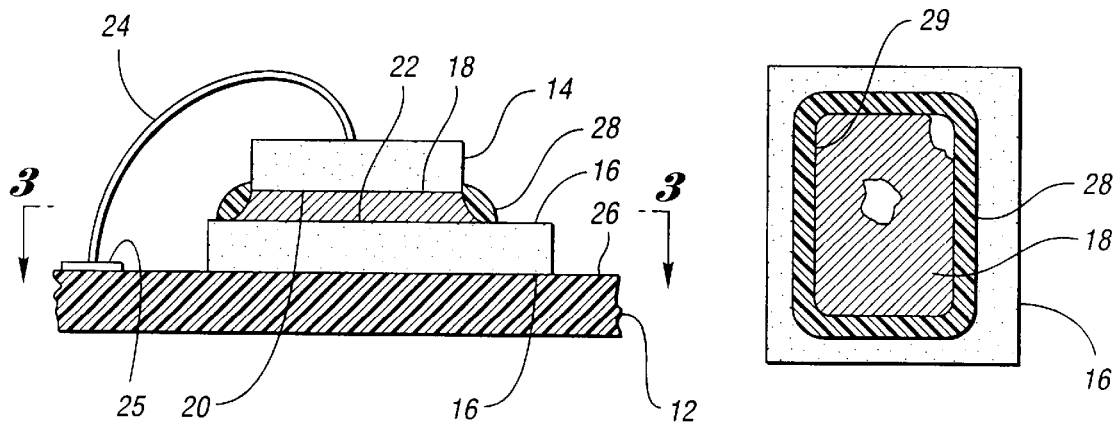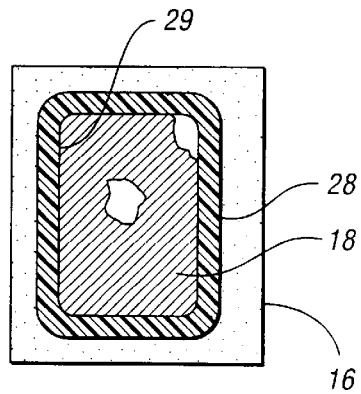
Fig. 2   Fig. 3
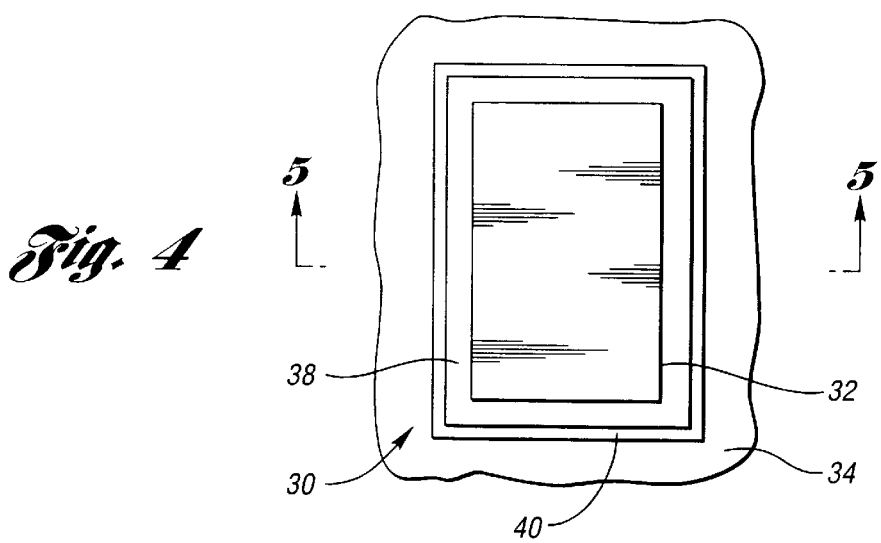
Fig. 4

HIGH-OPERATING-TEMPERATURE ELECTRONIC COMPONENT

TECHNICAL FIELD

The invention relates to methods and articles for attaching a relatively high-operating-temperature electronic component, such as a semiconductor die, to a substrate, such as a package substrate, heat spreader or electronic circuit board, to thereby mechanically secure the component to the substrate while further providing a thermally conductive path between the component and the substrate.

BACKGROUND OF THE INVENTION

In accordance with a known method for attaching an electronic component to a package substrate, a high-operating-temperature silicon semiconductor die is soldered to a copper heat spreader using a solder material whose melting or phase-transition temperature exceeds the nominal operating temperature of the resulting package. Since the coefficient of thermal expansion mismatch between the silicon die and the copper heat spreader is high, thermal stresses are induced in the solder during operation of the resulting package. Over time, thermal cycling is likely to generate cracks or voids in the solder, thereby reducing the area available for electrical and/or thermal transfer between the die and the heat spreader. The reduced heat transfer area, in turn, produces an increased junction temperature and may ultimately lead to a premature failure of the die. In some cases, the die can get separated from the heat spreader due to propagation of cracks in the solder.

In response, the prior art teaches the use of custom heat spreaders in an attempt to more closely match the thermal expansion coefficient of each heat spreader with that of the silicon die. For example, a laminated heat spreader is taught which includes a layer of material featuring a relatively low coefficient of thermal expansion, such as Invar, sandwiched between two layers of relatively higher thermal coefficient material, such as copper. However, such special copper-Invar-copper heat spreaders are costly to produce and, further, are less thermally conductive than their cheaper, monolithic copper counterparts. The die must, therefore, be operated at a lower power level to avoid undue thermal stresses and their attendant reliability problems.

Alternatively, the prior art teaches the use of relatively high temperature solder material to resist such crack propagation responsive to heat cycling. However, when such high-temperature solder materials are used, residual stresses are induced during solder reflow, which residual stresses contribute to premature failure of the assembly.

DISCLOSURE OF THE INVENTION

Accordingly, it is an object of the invention to provide a method and article for attaching an electronic component to a substrate by which the resulting package is rendered less susceptible to failure due to thermal cycling.

Under the invention, a method for attaching an electronic component, such as a semiconductor die, to a substrate for use at a temperature not to exceed a maximum operating temperature includes the step of applying to the substrate a quantity of a first thermally conductive die attach material, such as a solder material in the form of either a paste or a preform of nominal thickness, which softens or fully liquifies at a temperature less than the maximum operating temperature. The method also includes the steps of placing the component atop the applied solder material such that the die overlies a portion of, and more preferably, entirely overlies the applied solder material; and applying to the substrate, proximate to the applied solder, a quantity of a second die attach material, such as a relatively compliant bonding material, in an amount sufficient to contain the applied solder material and otherwise bridge the gap between the component and the substrate upon subsequent liquefaction and collapse of the applied solder material along its thickness dimension.

The method further includes the step of heating the applied solder material to a second temperature above the maximum operating temperature, whereupon the solder material collapses along its thickness dimension. Preferably, the solder material fully liquefies at the second temperature, and the solder material, otherwise contained between the component and the substrate by the bonding material, advantageously "wets" the opposed component and substrate surfaces as it collapses. The bonding material thereafter mechanically couples the component to the substrate while otherwise advantageously serves to contain the solder material between the component and the substrate, notwithstanding subsequent softening/liquefaction of the solder material during component operation.

In accordance with a feature of the invention, in an exemplary method of practicing the invention, the solder material is applied to the substrate in the form of a paste or a preform, whereby the solder material defines a lateral periphery of nominal thickness. Further, when depositing the curable bonding material directly on the substrate proximate to at least a first portion of the periphery of the applied solder material, a lateral space or void may advantageously be defined between deposited bonding material and the periphery of the applied solder material, thereby defining, within the confines of the applied bonding material, a volume into which liquified solder material may flow during the heating step without fouling either the bonding material or the solder material.

In accordance with another feature of the invention, the applied solder material may define an interior void into which the solder material may flow during the heating step, thereby ensuring that the solder material will not foul either the opposed die/substrate surfaces or the bonding material immediately prior to the curing of the latter.

In accordance with another feature of the invention, where the solder material is applied such that the applied solder material has a smaller footprint than the underside of the component, the method may alternatively include the steps of placing the die atop the solder material so as to overlie at least a portion of the applied bonding material; and heating the solder paste and the bonding material to collapse the thickness of the solder paste through the softening or at least partial liquefaction thereof such that the bonding material engages both the die and the substrate, and to subsequently cure the bonding material. As a further benefit, the collapse of the liquified solder material during the heating step ensures that the solder material will engage and "wet" the surface of both the die and the substrate, whereby a superior thermal couple and, where desired, a superior electrical couple are achieved.

In accordance with yet another feature of the invention, the bonding material may alternatively be deposited on (and about the periphery of) the solder material preform before the preform is applied to the substrate. In this instance, the peripherally deposited bonding material has a thickness that is no greater than, and preferably less than, the nominal thickness of the periphery of the preform. The heating step will then preferably include collapsing the solder preform along its thickness dimension, whereby appropriate "wetting" of opposed die and substrate surfaces with the liquified solder material is ensured.

In accordance with the invention, a semiconductor die package includes a die, a substrate, and a first thermally conductive die attach material, such as a low-melting-temperature solder material, extending between the die and the substrate to thermally and, perhaps, electrically couple the component to the substrate while preferably further providing a partial mechanical couple between the die and the substrate when the temperature falls below the package's maximum operating temperature. A second die attach material, such as a curable bonding material, is applied to the substrate proximate to the solder material. In an exemplary embodiment, the bonding material completely encircles the solder material to thereby define, upon engagement of the bonding material with both the die and the substrate, a weir by to retain the solder material between the die and substrate notwithstanding any softening and/or solid-to-liquid phase transition of the solder.

And, under the invention, an article for attaching an electronic component to a substrate includes generally flat preform of nominal thickness. The preform is formed of a first thermally conductive die attach material, such as a solder material, which softens or otherwise becomes at least partially liquified at a first temperature less than the maximum operating temperature of the component. The article further includes a quantity of a second elastically resilient die attach material, such as a heat-curable bonding material which cures at a second temperature greater than the maximum operating temperature of the component, in touching contact with at least a portion of the preform. An interior void of sufficient volume, preferably defined within the preform, advantageously ensures that the solder material will not flow outwardly upon collapse of the preform along its thickness dimension, thereby ensuring that the solder and bonding material will not foul each other when attaching the component to the substrate in accordance with the above-described method.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 1 is a plan view of an electronic circuit board to which is attached a pair of semiconductor die packages in accordance with the invention;

FIG. 2 is a cross-sectional view of one die package along line 2—2 of FIG. 1;

FIG. 3 is a cross-sectional view of the one die package along line 3—3 of FIG. 2;

FIG. 4 is a plan view of another die package in accordance with the invention;

DETAILED DESCRIPTION OF THE PREFERRED EMBODIMENTS

Figure 5:
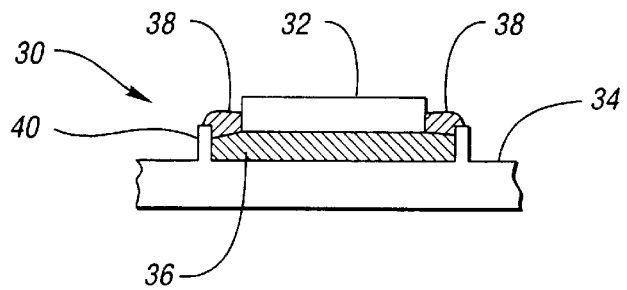
FIG. 5 is a cross-sectional view of the other die package along line 5—5 of FIG. 4.

Referring to the drawings, FIG. 1 shows a pair of identical high-operating-temperature semiconductor die packages 10 mounted atop an electronic circuit board 12 for use at an operating temperature not to exceed a maximum temperature. As seen more clearly in FIG. 2, in accordance with the invention, each package 10 includes a silicon die 14; a package substrate in the form of a heat spreader 16; and a quantity of a first thermally conductive die attach material, such as a low-melting-temperature solder material 18, extending between the opposed surfaces 20,22 of the die 14 and the heat spreader 16. The solder material 18 forms a thermal couple between the die 14 and the heat spreader 16 while preferably further providing a partial mechanical couple between the die 14 and the heat spreader 16 when the die temperature falls below the solidus temperature of the solder material 18.

In an exemplary embodiment suitable for use in an automotive application, wherein each package 10 may be expected to operate over a nominal temperature range of between about −40° C. to about 150° C., the solder material is preferably selected from a group consisting of non-eutectic materials, i.e., materials whose transition from solid to liquid phases occurs over a temperature range. Alternatively, eutectic or non-crystalline (amorphous) materials may be used, with the latter materials softening slowly, with no fixed transition temperature from solid to liquid phase.

Significantly, the invention contemplates use of a solder material which either substantially softens or otherwise transitions to at least a partially liquid state over a substantial portion of the package's operating temperature range. Thus, for example, for a nominal automotive application, a suitable solder material in accordance with the invention might liquify at about 80° C. and still provide substantial relief from thermal-cycling-induced stresses.

A list of ten suitable solder materials, including both eutectic and non-eutectic materials, are presented with their respective liquidus and solidus temperatures in Table I below:

TABLE I

| | Composition (wt. %) | | | | | Solidus Temperature, $T_S$ (° C.) | Liquidus Temperature, $T_L$ (° C.) |
|---|---|---|---|---|---|---|---|
| | Pb | Bi | Sn | In | Cd | | |
| Example 1 | 18 | 49 | 15 | 18 | | 58 | 69 |
| Example 2 | | 32.5 | 16.5 | 51 | | 60 | 60 |
| Example 3 | 46 | 30.7 | 18.2 | | 5.1 | 70 | 123 |
| Example 4 | 30 | 52 | 18 | | | 96 | 96 |
| Example 5 | 35 | 45 | 20 | | | 96 | 107 |
| Example 6 | 43 | 28.5 | 28.5 | | | 96 | 137 |
| Example 7 | 20 | 46 | 34 | | | 100 | 100 |
| Example 8 | | | 48 | 52 | | 100 | 118 |
| Example 9 | 40 | 10 | 50 | | | 120 | 167 |
| Example 10 | 50 | 20 | 30 | | | 130 | 173 |

As seen in FIGS. 1 and 2, wire bonds 24 provide electrical connections between each attached die 14 and a plurality of pads 25 formed on the surface 26 of the electronic circuit board 12. However, it will be appreciated that, where desired, the selected solder material may also be electrically conductive, such that the solder material 18 further serves to electrically couple the surface 20 of the die 14, for example, to another pad (not shown) formed on the surface 26 of the electronic circuit board 12 beneath the attached die 14.

Referring again to FIGS. 1–3, each package 10 further includes a quantity of second relatively mechanically compliant die attach material, such as any suitable epoxy, heat- or UV-curable adhesive, or metallic joining material (hereinafter, "bonding material 28"), extending between the opposed surfaces 20,22 of the die 14 and the heat spreader 16 proximate to the solder material 18. As seen in FIG. 3, the bonding material 28 may be applied to the substrate 16 so as to be in touching contact with the solder material 18. Alternatively, the bonding material 28 may be applied to the heat spreader 16 relative to the solder material 18 so as to define a lateral space or gap, between the applied bonding material and the solder material 18, within which the solder material 18 may flow upon collapse of the solder preform along its thickness dimension, as described further below. It will be appreciated that, where such a space or gap is defined within the applied bonding material 28, the entrapment of gases beneath the attached die is preferably avoided, in a known manner.

Under the invention, the bonding material 28 forms the primary mechanical couple between each die 14 and the heat spreader 16. The bonding material 28 is preferably selected so as to provide a relatively compliant mechanical couple between each die 14 and the heat spreader 16, thereby accommodating the thermal expansion of the die and the heat spreader and, thus, minimizing potential coefficient of thermal expansion mismatch. In an exemplary embodiment, the bonding material 28 is selected from a group of materials whose coefficient of thermal expansion is intermediate the respective coefficients of thermal expansion of the dies 14 and the heat spreader 16. In the context of the invention, the term "relatively compliant" is intended to mean that the bonding material 28 is able to accommodate such thermal mismatch without exhibiting, up to a temperature which exceeds the maximum operating temperature of the die 14, any substantial reduction in stiffness.

Further, in the exemplary embodiment shown in FIGS. 1–3, the bonding material 28 is preferably only minimally thermally conductive so as to reduce any thermal stresses applied to the die 14 upon thermal cycling of the package 10. Lastly, the bonding material 28 is not electrically conductive, thereby affording a greater range of bonding materials from which to choose. Indeed, it is significant that, under the invention, the bonding material 28 also serve to bond the die 14 directly to the upper surface 26 of the electronic circuit board 12.

As seen more clearly in FIG. 3, if the selected solder material at least partially liquifies and, hence, flows at a temperature less than the maximum operating temperature of the die 14, the bonding material 28 preferably encircles or encompasses the solder material 18 to thereby form a weir 29 by which to retain the solder material 18 between the die 14 and the heat spreader 16, notwithstanding any such phase transition of the solder material 18. If, however, the selected solder material 18 merely softens and, hence, is not likely to flow during normal operation of the package 10, the bonding material 28 need only be applied in a quantity sufficient to mechanically secure the die 14 to the heat spreader 16. Of course, even where the selected solder material is not likely to flow, i.e., where nonliquifying solder material 18 is used, the bonding material 28 may nonetheless encircle the solder material 18 for any other suitable purpose unrelated to restraining flow of the solder material 18.

Referring to FIGS. 4 and 5, another die package 30 in accordance with the invention includes a die 32, a substrate 34, a first die attachment material such as solder material 36 forming a thermal couple between the die 32 and the substrate 34, and a second die attachment material such as a heat-curable bonding material 38 forming a mechanical couple between the die 32 and the substrate 34.

Significantly, in the die package 30 illustrated in FIGS. 4 and 5, the substrate 34 includes an upwardly projecting wall portion 40 encircling the site on which the die 32 is to be mounted. The substrate wall portion 40 serves to partially contain the applied solder material 36 between the die 32 and the substrate 34 while further increasing the area on the substrate 34 which is engaged by the solder material 36, thereby advantageously increasing thermal transfer between the die 32 and the substrate 34 during component operation. The bonding material 38 continues to serve to mechanically couple the die 32 to the substrate 34 notwithstanding the softening or at least partial liquefaction of the solder material 36 during component operation.

Figure 6:
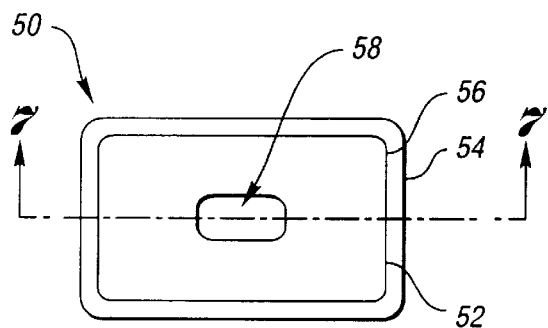
FIG. 6 is a plan view of an exemplary article in accordance with the invention for attaching an electronic component, such as a high-operating-temperature semiconductor die, to a substrate.
Figure 7:
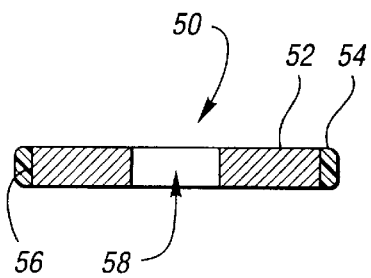
FIG. 7 is a cross-sectional view of the exemplary article along line 7—7 of FIG. 6.

FIGS. 6 and 7 show an exemplary article 50 in accordance with the invention for attaching an electronic component to a substrate. The article 50 includes a preform 52 formed of a first thermally conductive die attach material, such as a solder paste 18, which softens or otherwise at least partially liquifies at a first temperature less than the maximum operating temperature of the component. The article 50 further includes a quantity of a heat-curable bonding material 54 deposited about the periphery 56 of the solder preform 52, the bonding material 54 being cured when heated to a temperature significantly greater than the maximum operating temperature of the component. Significantly, as seen in FIG. 7, the maximum thickness of the deposited bonding material 54 is no greater than the minimum thickness of the solder preform 52, and the solder preform 52 is further provided with an internal void 58 of sufficient volume to ensure that the solder paste and the bonding material 54 do not foul each other upon slight collapse of the solder preform 52 along its thickness dimension (as will occur upon heating the resulting component-article-substrate package to cure the bonding material 54 ).

Figure 8:
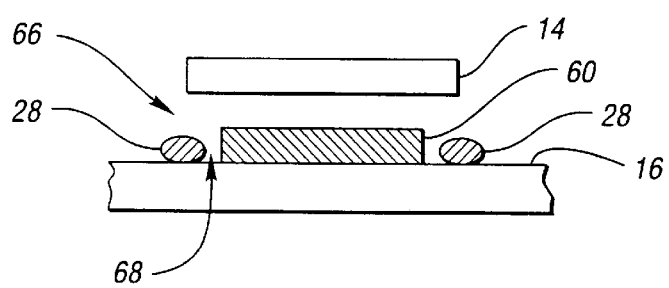
FIG. 8 is an cross-sectional view of a die package similar to FIG. 2, immediately prior to the collapsing step.

Under the invention, an exemplary method for attaching an electronic component, such as a die 14, to a substrate, such as a heat spreader 16, for use at an operating temperature not to exceed a maximum operating temperature is provided. As seen in FIG. 8, the method includes the steps of applying a quantity of a low-temperature solder material 18 to the heat spreader 16, preferably as a preform 60, with the solder preform defining a lateral periphery 62 of nominal thickness; placing the die 14 atop the applied solder preform 60 so as to overlie at least a portion of, and more preferably, to fully overlie the applied solder preform 60; and applying a quantity of a bonding material 28 proximate to the heat spreader 16 about periphery of the solder preform 60, preferably such that the lateral edges 64 of the die 14 at least partially overlies the applied bonding material 28, in an amount sufficient to contain the solder material 18 and otherwise bridge the gap 66 between the die 14 and the heat spreader 16 upon subsequent liquefaction and collapse of the solder preform 60 along its thickness dimension.

The method further includes the step of heating the solder preform 60 to collapse its thickness, as through the full liquefaction of the solder preform 60, to thereby ensure that the opposed surfaces of the die 14 and the heat spreader 16 are respectively "wet" by the liquified solder material 18 as the preform 60 collapses along its thickness dimension. In this manner, the solder material 18 achieves an improved thermal couple and, with appropriate materials selection where desired, electrical couple between the component and the substrate. Such collapse of the solder preform 60 further advantageously ensures the proper engagement of the bonding material with the die 14 and the heat spreader 16. And, subsequent to such collapse of the solder preform 60, the bridging bonding material 28 serves to mechanically couple the die 14 to the heat spreader 16 once it has been cured in any suitable manner. And, where the bonding material 28 is a heat-curable material, the heating step may advantageously serve to cure the bonding material 28 to thereby complete the attachment of the die 14 to the heat spreader 16.

As noted above, in a preferred method of practicing the invention, the solder preform 60 may preferably include a hollow region or interior void (not shown), i.e., a region remote from that portion of the preform's periphery 62 along which bonding material 28 is applied, to further facilitate collapse of the preform 60 during the heating step while ensuring that solder material 18 is not forced outwardly into the deposited bonding material 28. More specifically, the use of an interior void of sufficient dimension advantageously ensures that collapse of the solder preform 60 during the heating step will not encourage the flow of solder material 18 into the encircling bonding material 28 or otherwise foul the bonding material-engaging portion of the dies's underside.

Indeed, a further benefit of having an internal void defined within the solder preform is that it permits the bonding material 28 to be first deposited on the preform's periphery prior to be applied to the substrate, as described above in connection with FIGS. 6 and 7. Thus, under the invention, the step of applying bonding material may be performed by depositing a quantity of bonding material to the periphery of the solder preform prior to applying (placing) the solder preform onto the substrate, with the deposited bonding material preferably having a maximum thickness slightly less than the nominal thickness of the preform's periphery in order to prevent fouling and otherwise ensure subsequent collapse of the encircled preform.

Alternatively, as seen in FIG. 6, the invention contemplates applying the bonding material 28 directly to the heat spreader 16 so as to define a lateral space or void 68 between the thus-applied bonding material 28 and the periphery 62 of the solder preform 60. In this manner, outward expansion of the solder material 18 is permitted during the subsequent heating step without risking the fouling of the solder material 18, the bonding material 28 or the underside of the die 14.

While the best mode for carrying out the invention has been described in detail, those familiar with the art to which this invention relates will recognize various alternative designs and embodiments for practicing the invention within the scope of the appended claims.

What is claimed is:

1. A semiconductor die package for operation at first temperature not to exceed a maximum operating temperature, the package comprising:
   a semiconductor die;
   a package substrate;
   a quantity of a first thermally conductive die attach material extending between the die and the substrate, the first material softening or at least partially liquefying at the first temperature, the first material forming a thermal couple between the die and the substrate; and
   a quantity of a second die attach material extending between the die and the substrate, the second material forming a relatively compliant mechanical couple between the die and the substrate up to a second temperature greater than the maximum operating temperature.

2. The package of claim 1, wherein the first material defines a lateral periphery, and wherein the second material is in touching contact with at least a portion of the periphery.

3. The package of claim 1, wherein the second material completely surrounds the first material.

4. The package of claim 1, wherein the first material has a transition temperature in the range of between about −40° C. and about 150° C.

5. The package of claim 1, wherein the first material includes at least two of the group consisting of Pb, BI, Sn, In and Cd.

6. The package of claim 1, wherein the first material forms an electrical couple between the die and the substrate.

7. The package of claim 1, wherein the second material is a heat-curable bonding material.

8. The package of claim 7, wherein the second material is substantially electrically non-conductive.

9. An article for attaching an electronic component to a substrate for use at a first temperature not to exceed a maximum operating temperature, the article comprising:
   a generally flat preform formed of a quantity of a first thermally conductive die attach material and defining a lateral periphery having a nominal thickness, the first material softening or at least partially liquefying at a first temperature less than the maximum operating temperature; and
   a quantity of a second die attach material in touching contact with at least a portion of the periphery of the preform, in an amount sufficient to contain the applied solder material and otherwise bridge the gap between the component and the substrate upon subsequent liquefaction and collapse of the applied solder material along its thickness dimension.

10. The article of claim 9, wherein the quantity of the second material completely surrounds the preform.

11. The article of claim 10, wherein the quantity of the second material defines a first interior volume, and wherein the quantity of the first material has a second volume which is less than the first volume.

12. The article of claim 9, wherein the preform includes an internal void.

13. The article of claim 9, wherein the first material has a transition temperature in the range of between about −40° C. and about 150° C.

14. The article of claim 9, wherein the first material includes at least two of the group consisting of Pb, BI, Sn, In and Cd.

15. The article of claim 9, wherein the second material is a heat-curable bonding material.

* * * * *